(12) United States Patent
Potera

(10) Patent No.: US 11,152,503 B1
(45) Date of Patent: Oct. 19, 2021

(54) SILICON CARBIDE MOSFET WITH WAVE-SHAPED CHANNEL REGIONS

(71) Applicant: SemiQ Incorporated, Lake Forest, CA (US)

(72) Inventor: Rahul R. Potera, Irvine, CA (US)

(73) Assignee: SEMIQ INCORPORATED, Lake Forest, CA (US)

(*) Notice: Subject to any disclaimer, the term of this patent is extended or adjusted under 35 U.S.C. 154(b) by 0 days.

(21) Appl. No.: 17/019,595

(22) Filed: Sep. 14, 2020

Related U.S. Application Data

(63) Continuation-in-part of application No. 16/675,161, filed on Nov. 5, 2019, now Pat. No. 10,950,695.

(51) Int. Cl.
*H01L 29/78* (2006.01)
*H01L 29/417* (2006.01)
(Continued)

(52) U.S. Cl.
CPC ...... *H01L 29/7813* (2013.01); *H01L 29/0696* (2013.01); *H01L 29/0869* (2013.01);
(Continued)

(58) Field of Classification Search
CPC ......... H01L 29/7832; H01L 29/66674–66734; H01L 29/7801–7826; H01L 29/04–045; H01L 29/16–1608; H01L 29/18–185; H01L 29/22–2206; H01L 29/36–365; H01L 29/0856–0869; H01L 29/0873–0886; H01L 29/1058; H01L 29/1066; H01L 29/66893–66924; H01L 29/8086; H01L 2924/13062; H01L 27/098; H01L 27/14679; H01L 29/66901–66909; H01L 29/66916; H01L 29/66431; H01L 29/66462; H01L 29/1604;
(Continued)

(56) References Cited

U.S. PATENT DOCUMENTS 5,008,725 A 4/1991 Lidow et al.
5,703,389 A 12/1997 Knoch et al.
(Continued)

OTHER PUBLICATIONS

Kahn et al "High-Voltage UMOSFETs in 4H SiC," IEEE Conference Jun. 7, 2002, pp. 157-160. ISBN:0-7803-7318-9.
(Continued)

*Primary Examiner* — Moin M Rahman
(74) *Attorney, Agent, or Firm* — The Law Offices of Bradley J. Bereznak

(57) ABSTRACT

A silicon carbide MOSFET includes a plurality of first and second trenches each of which extends a predetermined vertical distance from the top of a source down through a body region and into a current spreading layer (CSL). An insulated gate member is disposed in each first trench. The first trenches are each arranged in a wave-shaped pattern that extends in first and second lateral directions. Each of the second trenches is disposed between a pair of adjacent first trenches in the first lateral direction. A shielding region extends vertically from the bottom of each of the second trenches down into a drift region. A top metal layer fill each of the second trenches and electrically contacts the source region, the body region, the CSL, and the shielding region. A bottom metal layer electrically contacts the drain region.

21 Claims, 14 Drawing Sheets

(51) Int. Cl.
*H01L 29/06* (2006.01)
*H01L 29/10* (2006.01)
*H01L 29/08* (2006.01)
*H01L 29/423* (2006.01)
*H01L 29/66* (2006.01)
*H01L 29/16* (2006.01)

(52) U.S. Cl.
CPC ...... *H01L 29/1045* (2013.01); *H01L 29/1608* (2013.01); *H01L 29/41741* (2013.01); *H01L 29/4236* (2013.01); *H01L 29/4238* (2013.01); *H01L 29/66068* (2013.01); *H01L 29/7803* (2013.01); *H01L 29/086* (2013.01)

(58) Field of Classification Search
CPC ... H01L 29/161–167; H01L 29/66053–66068; H01L 27/092–0928; H01L 29/66477–6684; H01L 29/78–7926; H01L 29/1033–1054; H01L 29/20–2006
See application file for complete search history.

(56) References Cited

U.S. PATENT DOCUMENTS

| | | | |
|---|---|---|---|
| 7,498,633 | B2 | 3/2009 | Cooper et al. |
| 8,076,719 | B2 | 12/2011 | Zeng et al. |
| 9,997,599 | B2 | 6/2018 | Cooper |
| 2015/0001549 | A1 | 1/2015 | Miura et al. |
| 2015/0028350 | A1* | 1/2015 | Suvorov ............... H01L 21/047 257/77 |
| 2018/0026132 | A1 | 1/2018 | Cooper, Jr. |
| 2018/0096991 | A1 | 4/2018 | Nasu et al. |
| 2019/0252497 | A1 | 8/2019 | Chao et al. |

OTHER PUBLICATIONS

Peters et al. "Performance and ruggedness of 1200V SiC Trench MOSFET", 2017 29th International Symposium on Power Semiconductor Devices and IC's (ISPSD), pp. 239-242, 2017.

Williams et al. "The Trench Power MOSFET: Part I—History, Technology, and Prospects," IEEE Transactions on Electron Devices, vol. 64, No. 3, Mar. 2017, pp. 674-691.

Nakamura et al. "High Performance SiC Trench Devices With Ultra Low Ron," 2011 International Electron Devices Meeting, Dec. 5-7, 2011, Washington D.C. USA, p. 26.5.1-26.5.3. Electronic ISSN: 2156-017X.

Ebihara et al. "Deep-P Encapsulated 4H-SiC Trench MOSFETs With Ultra Low RonQgd," Proceedings of the 30th International Symposium on Power Semiconductor Devices & ICs, May 13-17, 2018, Chicago, USA, pp. 44-47.

Takaya et al. "A 4H-SiC Trench MOSFET with Thick Bottom Oxide for Improving Characteristics," Proceedings of the 25th International Symposium on Power Semiconductor Devices & ICs, May 26-30, 2013, Kanazawa, Japan, pp. 43-46.

* cited by examiner

SILICON CARBIDE MOSFET WITH WAVE-SHAPED CHANNEL REGIONS

RELATED APPLICATIONS

The present application is a continuation-in-part (CIP) application of U.S. patent application Ser. No. 16/675,161, filed Nov. 5, 2019, entitled, "Silicon Carbide Planar MOSFET With Wave-Shaped Channel Regions", the entirety of which is hereby incorporated by reference.

TECHNICAL FIELD

The present disclosure relates to silicon carbide power semiconductor devices. More specifically, the present invention relates to silicon carbide metal-oxide semiconductor field-effect transistor (MOSFET) device structures and layouts capable of withstanding high voltages.

BACKGROUND

High-voltage, field-effect transistors, also known as power transistors or power semiconductor devices, are well known in the semiconductor arts. Most often, a high-voltage power transistor comprises a vertical transistor device structure that includes an extended drain or drift region that supports the applied high-voltage when the device is in the "off" state. Power transistors of this type are commonly used in power conversion applications such as AC/DC converters for offline power supplies, motor controls, and so on. These power transistor devices can be switched at high voltages and achieve a high blocking voltage in the "off" state while minimizing the resistance to current flow between the drain and source, often referred to as the specific on-resistance ($R_{on}$), in the "on" state.

Power MOSFETs are commonly based on silicon and other wide bandgap semiconductor materials, such as silicon carbide. Silicon carbide (SiC) MOSFETs are advantageously utilized in certain electronic devices due to their superior physical properties over silicon-based devices of the same device area. For example, SiC MOSFETs are known to exhibit higher blocking voltage, lower $R_{on}$, and higher thermal conductivity as compared to silicon MOSFETs. A double-implanted metal-oxide semiconductor field-effect transistor (DMOSFET) may be formed in a SiC substrate.

Another traditional structure used in power SiC MOSFETs is a U-shaped MOSFET (UMOSFET), also referred to as a trench-gate or trench MOSFET. In fabricating a SiC UMOSFET a deep vertical trench is typically formed in the SiC substrate using a process known as reactive ion etching. A dielectric (e.g., silicon dioxide) is then formed on along the sidewalls and bottom of the trench. The remaining area inside the trench is then typically filled with polysilicon, which functions as the gate of the MOSFET. During operation in the on-state a conductive channel region is formed along the vertical sidewall of the trench.

Many power MOSFETs employ a device structure that includes an extended drain region that supports or blocks the applied high-voltage (e.g., hundreds of volts or more) when the device is in the "off" state. In a conventional vertical power MOSFET device structure, an epitaxial layer of semiconductor material forms an extended drain or drift region for current flow in the on-state. Application of an appropriate voltage potential to the gate causes a conductive channel to be formed in a body region such that current may flow through the channel and then vertically downward through semiconductor material, i.e., from a top surface of the SiC substrate where the source region is disposed, down to the bottom of the SiC substrate where the drain region is located.

The specific on-resistance ($R_{on}$) in a vertical power MOSFET is a combination of the channel resistance, JFET resistance, drift region resistance and substrate resistance. The channel resistance is a function of semiconductor material, channel width, channel length, operating conditions (e.g., drain current and voltage), carrier mobility and cell pitch. For optimal performance in the on-state, it is desirable to minimize $R_{on}$. In a SiC power transistor device channel resistance is relatively high and carrier mobility is relatively low. However, drift region resistance is a direct function of blocking voltage. Consequently, channel resistance dominates $R_{on}$ at voltages less than about 1200 volts.

Past approaches to reducing the drain-to-source on-resistance of SiC power MOSFETs have typically required complicated processing steps including trenches, new technologies, or trade-offs with respect to other device performance parameters, e.g., breakdown voltage. Additionally, attempts to lower $R_{on}$ by reducing the length of the channel region have been largely unsuccessful as it adds leakage that lowers the blocking voltage of the device.

In a traditional trench MOSFET structure the highest electric field while blocking drain-source voltage in the off-state is located at the bottom corner of the trench. For instance, SiC avalanche breakdown typically starts at ~2.2 MV/cm. Scaling for the different dielectric constant between $SiO_2$ and silicon, the maximum electric field in $SiO_2$ is greater than 6 MV/cm before SiC breaks down.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
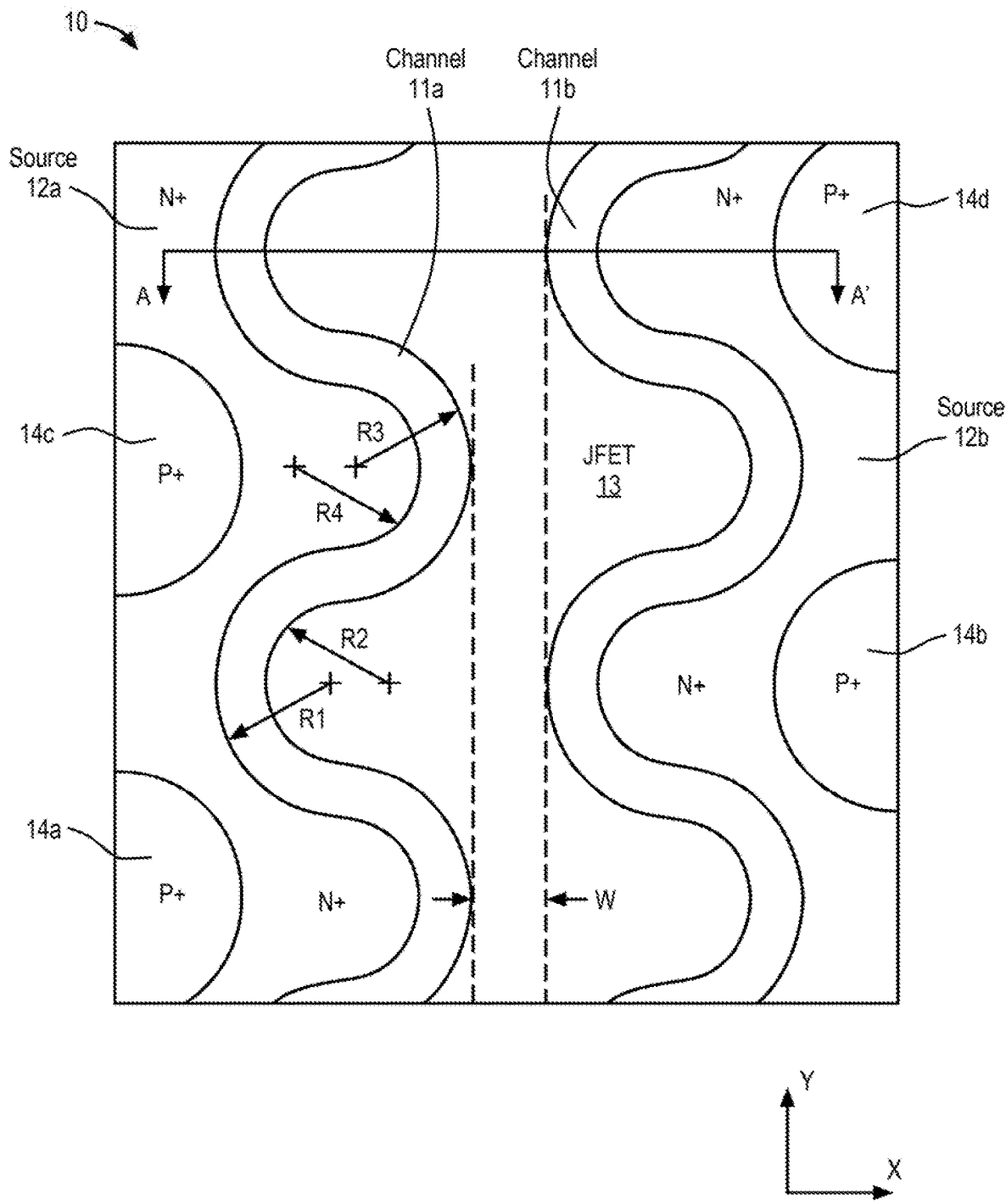
FIG. 1 is a top level view of an example layout for a SiC MOSFET device structure with serpentine or wave-shaped channel regions.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the disclosed subject matter. Also, common but well-understood elements that are useful or necessary in a commercially feasible embodiment are often not depicted in order to facilitate a less obstructed view of these various embodiments presented.

DETAILED DESCRIPTION

In the following description numerous specific details are set forth in order to provide a thorough understanding of the disclosed subject matter. It will be apparent, however, to one having ordinary skill in the art that the specific details need not be employed to practice the various embodiments described. In other instances, well-known systems, devices, or methods have not been described in detail in order to avoid obscuring the disclosed subject matter.

Reference throughout this specification to "one embodiment", "an embodiment", "one example" or "an example" means that a particular feature, structure or characteristic described in connection with the embodiment or example is included in at least one embodiment of the disclosed subject matter. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

As used herein, a "wafer" is a thin slice of crystalline material, such as silicon carbide, used in the fabrication of semiconductor devices and integrated circuits. The term "substrate" refers to the semiconductor supporting material upon which or within which the elements of a semiconductor device are fabricated, which substantially comprises the thickness of a wafer. Upon completion of the fabrication process the wafer is typically scribed and broken into individual semiconductor die, each of which consists of one or more semiconductor devices.

In the context of the present application, when a transistor is in an "off state" or "off" the transistor does not substantially conduct current. Conversely, when a transistor is in an "on state" or "on" the transistor is able to substantially conduct current. By way of example, a power transistor may comprise an N-channel MOSFET with a SiC substrate and SiC epitaxial layer which, in the off-state, supports a high blocking voltage between the first terminal, a drain, and the second terminal, a source. The power MOSFET may comprise a power switch that is driven by an integrated controller circuit to regulate energy provided to a load.

A SiC MOSFET device structure having a layout with serpentine or wave-shaped regions is described. In one embodiment, a planar SiC MOSFET device structure has a layout that provides a lower specific on-state resistance as compared to prior art approaches, while supporting very high voltages in the off-state. In other embodiments the planar SiC MOSFET device structure layout is modified to reduce lateral transistor cell pitch, which further helps lower $R_{on}$.

In yet another embodiment, a trench SiC MOSFET device structure has a layout with wave-shaped trenches wherein conduction channels are formed along the sidewalls of the trenches when the device in is the on-state. The trench SiC MOSFET device structure includes a deep P+ implant region disposed beneath the bottom of a second type of trench or pit. The deep P+ region functions to shield the gate oxide of the MOSFETs from high electric fields in the off or blocking state.

FIG. 1 is a top level view of an example planar layout for a single SiC MOSFET 10 with channel regions 11 arranged in a serpentine or wave-shaped layout pattern. It is appreciated that the portion of the layout shown may represent a single transistor cell. The transistor cell shown may be replicated in a mirrored or translated fashion many times in both the X and Y lateral directions across a wafer to form a completely fabricated MOSFET device. Thus, there may be repetitions of the wave-shaped regions across the semiconductor die. The MOSFET 10 of FIG. 1 includes highly-doped N+ source regions 12a & 12b that adjoin the outer sidewalls or boundaries of respective low-doped P-type channel regions 11a & 11b. A centrally-located N+ JFET region 13 adjoins the inner sidewalls of channel regions 11a & 11b.

Each of the channel regions 11 in the example of FIG. 1 is formed as a serpentine or wave-shaped pattern of semi-circular regions that extend in the lateral X and Y directions, with the semi-circular regions alternating orientation by 180 degrees in a wave-like manner along the lateral Y-direction. The channel length, as measured at any tangential point along the sides of channel regions 11 is a constant length. In one embodiment the channel length is about 0.6 μm. In other words, the radius of the inner and outer semi-circular sides that define the wave-shape of channels 11 are determined to be an identical distance so that the channel length separating source 12 from JFET region 13 is constant length. By way of example, adjacent semi-circular portions of channel 11a are shown in FIG. 1 having radiuses $R_1=R_2=R_3=R_4$.

Practitioners in the art will appreciate that the wave-shaped channel regions 11a & 11b are shown in FIG. 1 as being in-phase. That is, each channel region 11 "crests" toward the right-hand side of the cell in the X-direction at the same points in the Y-direction. Similarly, each channel region 11 "crests" toward the left-hand side of the cell in the X-direction at the same points in the Y-direction.

Also shown in the layout of SiC MOSFET 10 are a plurality of circular-shaped, highly-doped P+ body regions 14 that adjoin source regions 12. For instance, P+ body regions 14a & 14c are shown laterally adjoining source region 12a. Likewise, P+ body regions 14b & 14d are shown laterally adjoining source region 12b. Note that P+ body regions 14a & 14c are located in pocket areas to the left of channel region 11a, and P+ body regions 14b & 14d are located in pocket areas to the right of channel region 11b.

In addition, the locations of P+ body regions 14b & 14d in the Y-direction are 180 degrees out-of-phase with respect to the position in the Y-direction of P+ body regions 14a & 14c. P+ body regions 14a & 14c are respectively located under the semi-circular portions (pockets) of channel region 11a that are shown cresting toward the right-hand side of the cell, whereas P+ body regions 14b & 14d are respectively located under the semi-circular portions (pockets) of channel region 11b that are shown cresting toward the left-hand side of the transistor cell. In one embodiment, the radius of each P+ body region 14 is about 1.1 µm.

It should be understood that in other embodiments there need not be a P+ body region disposed under each cresting portion of the wave-shaped channel regions. In other words, other embodiments may have fewer P+ body regions than what is shown in FIG. 1, with the P+ body regions being farther spaced-apart in the Y-direction. Reducing the number of P+ body regions may decrease source resistance versus body contact resistance. Furthermore, in still other embodiments, the shape of the P+ body regions need not be circular in shape; instead, they may be formed as other curved or rectilinear shapes.

Practitioners in the art will appreciate that locating the P+ body regions in the pocket areas of the wave-shaped channel regions helps to reduce cell pitch in the lateral X direction, which reduces $R_{on}$. In addition, the width of the channel in the Y direction is increased due to the wave-shaped layout, which substantially reduces the channel resistance, thereby further reducing $R_{on}$. Because the channel length is the same along all points of the wave-shaped channel region the likelihood of leakage due to short channel effect is also reduced.

Figure 2:
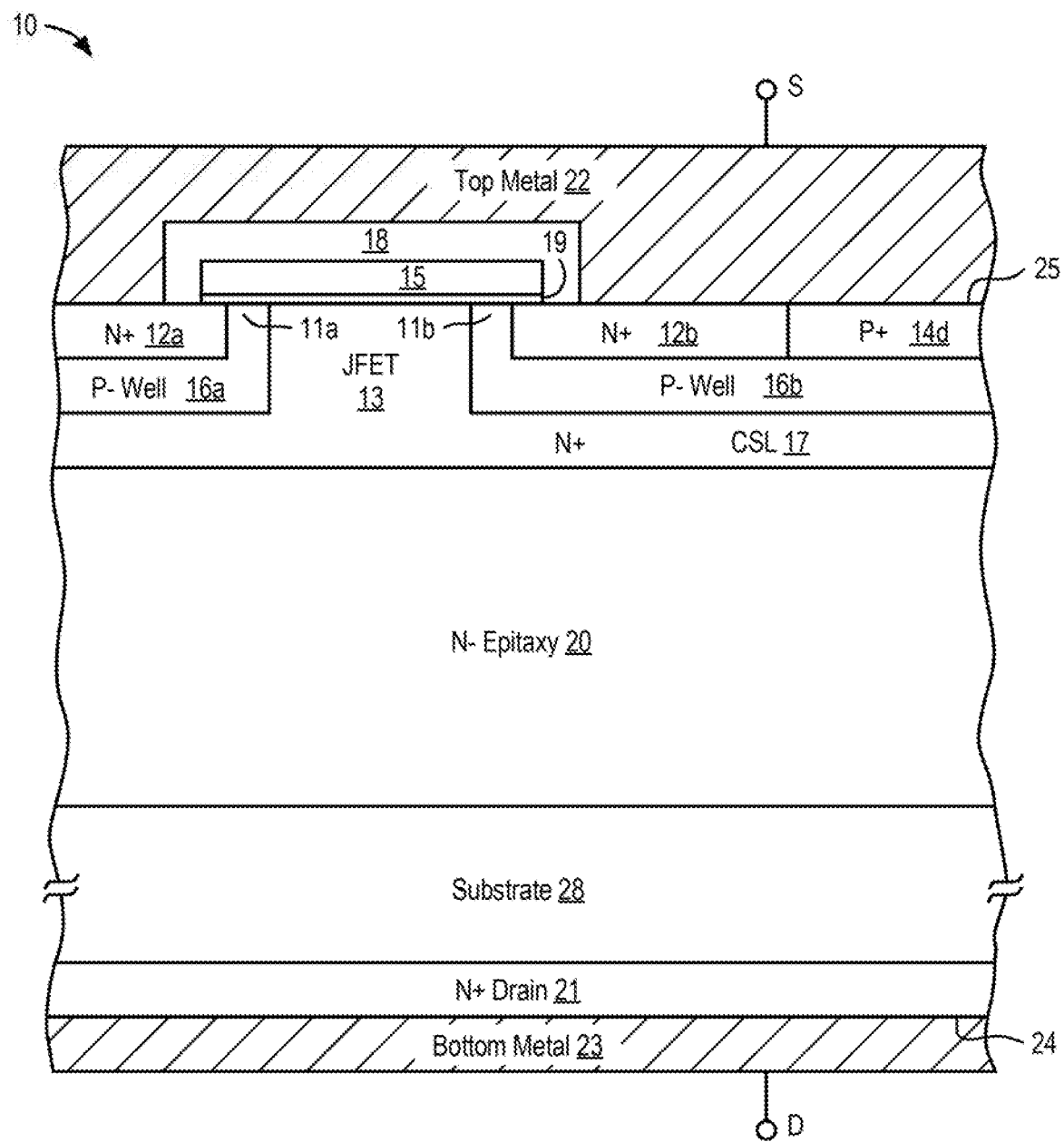
FIG. 2 is an example cross-sectional side view of the SiC MOSFET device layout shown in FIG. 1, as taken along cut lines A-A'.

FIG. 2 is an example cross-sectional side view of the SiC MOSFET device layout shown in FIG. 1, taken along cut lines A-A'. SiC MOSFET 10 is a vertical transistor structure with a highly-doped N+ drain region 21 disposed on a planar surface 24 of the bottom SiC substrate 28. A bottom metal layer 23 forms a drain terminal that provides electrical (ohmic) contact with N+ drain region 21. A lightly-doped N− epitaxial layer 20 is disposed above N+ drain 21 and bottom substrate 28. Epitaxial layer 20 forms an extended drain or drift region of SiC MOSFET 10. Epitaxial layer 20 may be formed by a Chemical Vapor Deposition (CVD) process.

A highly-doped N+ current spreading layer (CSL) 17 is shown disposed above N− epitaxy layer 20. A portion of N+ CSL 17 is shown extending up to a top planar surface 25 of the substrate. The portion that extends up to top surface 25 forms the JFET region 13 of SiC MOSFET 10. JFET region 13 is bounded laterally by low-doped P− well regions 16a & 16b. Extending to top surface 25 and disposed within P− well regions 16a & 16b are respective N+ source regions 12 & 12b. A P+ body region 14d is also shown disposed in P− well 16b at top surface 25 adjoining N+ source region 12b.

The channel regions 11a & 11b are defined in the substrate where the respective P− wells 16a & 16b extend up to top planar surface 25. The length of each channel region 11 is measured by the lateral distance between the source region 12 and JFET region 13.

By way of example, for a 1200 V MOSFET device N− epitaxial layer 20 may have a doping concentration of about 9E15/cm3 and a thickness of about 10 µm. Bottom SiC substrate 28 may have a doping concentration of about 4E18/cm3 with the thickness being in a range of 100 µm to 360 µm. P− wells 16 are about 1 µm deep beneath top surface 25 and have a retrograde doping profile of about 2E18/cm3 near the junction with N− epitaxial layer 20 lowering to about 1E17/cm3 in the channel region 11 near top surface 25. N+ source regions 12 and P+ body regions 14 are both shallow and doped to a concentration of about 1E19/cm3. JFET region 13 typically has a doping that is higher than N− epitaxial layer 20, but much lower than N+ source regions 12.

Continuing with the example of FIG. 2, a gate member 15 is shown disposed above channel regions 11a & 11b, JFET region 13, and a small portion of N+ source regions 12a & 12b. In one embodiment, gate member 15 comprises polysilicon. A thin gate dielectric (e.g., oxide) separates gate member 15 from top surface 25 of the semiconductor substrate. An interlayer dielectric (ILD) 18 covers the top and sides of gate member 15, fully insulating gate member 15 from top metal layer 22. Top metal layer 22 comprises a source terminal that electrically contacts source regions 12a & 12b and P+ body region 14d.

In the top view of FIG. 1, gate member 15 is not shown for clarity reasons. However, persons of skill in the art would understand that gate member 15 may extend from slightly past the left-side of channel region 11a to slightly past the right-side of channel region 11b. Gate member 15 follows the same serpentine pattern along the far sides of channel regions 11a & 11b.

When a sufficiently high voltage is applied to gate member 15 relative to source region 12, a conduction channel forms just beneath top planar surface 25 in each channel region 11. Thus, in the on-state current flows in MOSFET 10 horizontally from source regions 12 to JFET region 13, and then vertically down through CSL 17 and N− epitaxy layer (extended drain region) 20 to N+ drain region 21.

It is appreciated that in one embodiment MOSFET 10 may be fabricated as a double-implanted metal-oxide, semiconductor field-effect transistor (DMOSFET).

Figure 3:
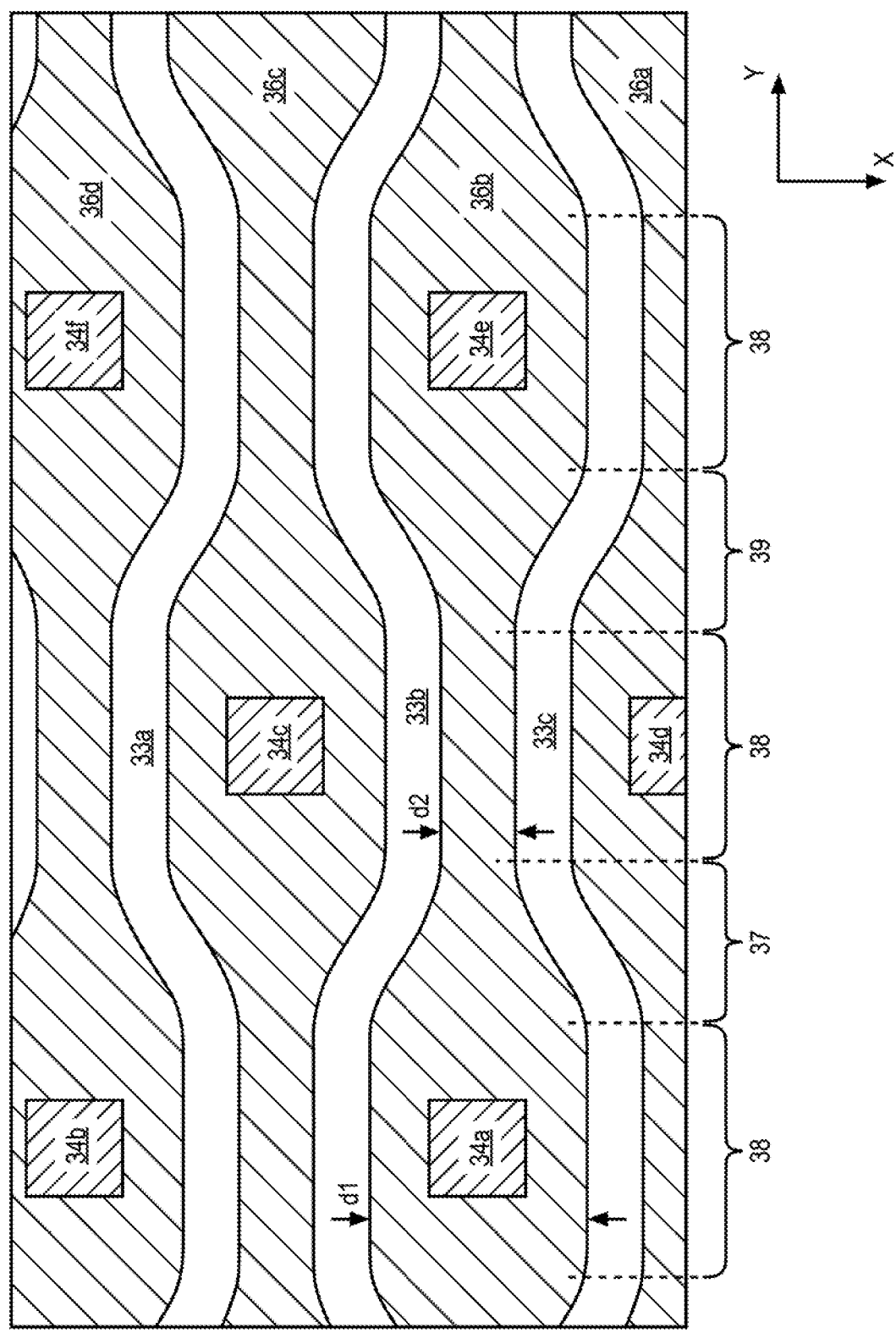
FIG. 3 is a top level view of another example layout for a SiC MOSFET device structure with serpentine or wave-shaped regions.

FIG. 3 is a top level view of another example layout for a SiC MOSFET device structure with regions having a serpentine or wave-shaped pattern, where the curved waveshape is interrupted by straight sections. The layout of FIG. 3 shows JFET regions 33a-33c having a serpentine shape with straight sections 38 that are alternately connected by curved sections 37 & 39. It is appreciated that sections 37 & 39 are identically-shaped but mirrored with respect to one another. As shown, ascending section 37 shifts the serpentine layout up in the X direction and descending section 39 shifts it down in the X direction. Note that the straight sections 38 are all aligned with each other in the X direction with adjacent serpentine-shaped JFET regions being 180 degrees out-of-phase. This layout causes the straight sections of adjacent JFET regions 33b and 33c to be alternately separated by a wide distance $d_1$ and a narrow distance $d_2$ measured in the X direction.

Adjacent JFET regions 33 are shown being separated in the X direction by P− well regions 36. For example, JFET region 33a is separated from JFET region 33b by P− well region 36c, and JFET region 33b is separated from JFET region 33c by P− well region 36b. A square-shaped P+ body region (contact) 34 is shown centrally-disposed in each area where adjacent straight sections 38 are separated by wide distance $d_1$. For instance, P+ body regions 34a & 34e are shown centrally-disposed in the areas of P− well region 36b between the straight sections 38 of adjacent JFET regions 33b & 33c that are separated by distance $d_1$. Similarly, P+ body region 34c is shown centrally-disposed in the area of P− well 36c between the straight sections 38 of adjacent JFET regions 33a & 33b that are separated by distance $d_1$.

It is appreciated that in other embodiments, not every area of P− well region 36 between the straight sections 38 of adjacent JFET regions 33 may include a P+ body region 34.

Note that the source regions are not shown in the top view of FIG. 3 for clarity reasons. Persons of skill in the art will understand that the source regions adjoin P+ regions 34 covering the P− well regions except for the narrow channel regions disposed on opposite sides of the JFET regions. The channel regions follow the serpentine shape of each of the JFET regions. It is appreciated that an N+ source implant may be utilized to form the N+ source regions that define the channel regions (see FIG. 1). The p-type channel regions are the part of the P− well regions 36 that are not implanted with the N+ source impurity.

It is appreciated that in different embodiments the length of the straight sections in the Y direction, as well as the length and shape of the curved sections, may vary. Practitioners in the art will understand that longer straight sections reduce source contact resistance, whereas shorter straight sections increase the wave nature of the channel, thus reducing channel resistance. Similarly, the shape of the P+ body regions may vary, e.g., oval, circular, rectangular, etc. In still other embodiments, the SiC MOSFET may include a combination of short and long straight sections, with the short sections being aligned with each other, and the long sections being aligned with each other, in the X direction.

Figure 4:
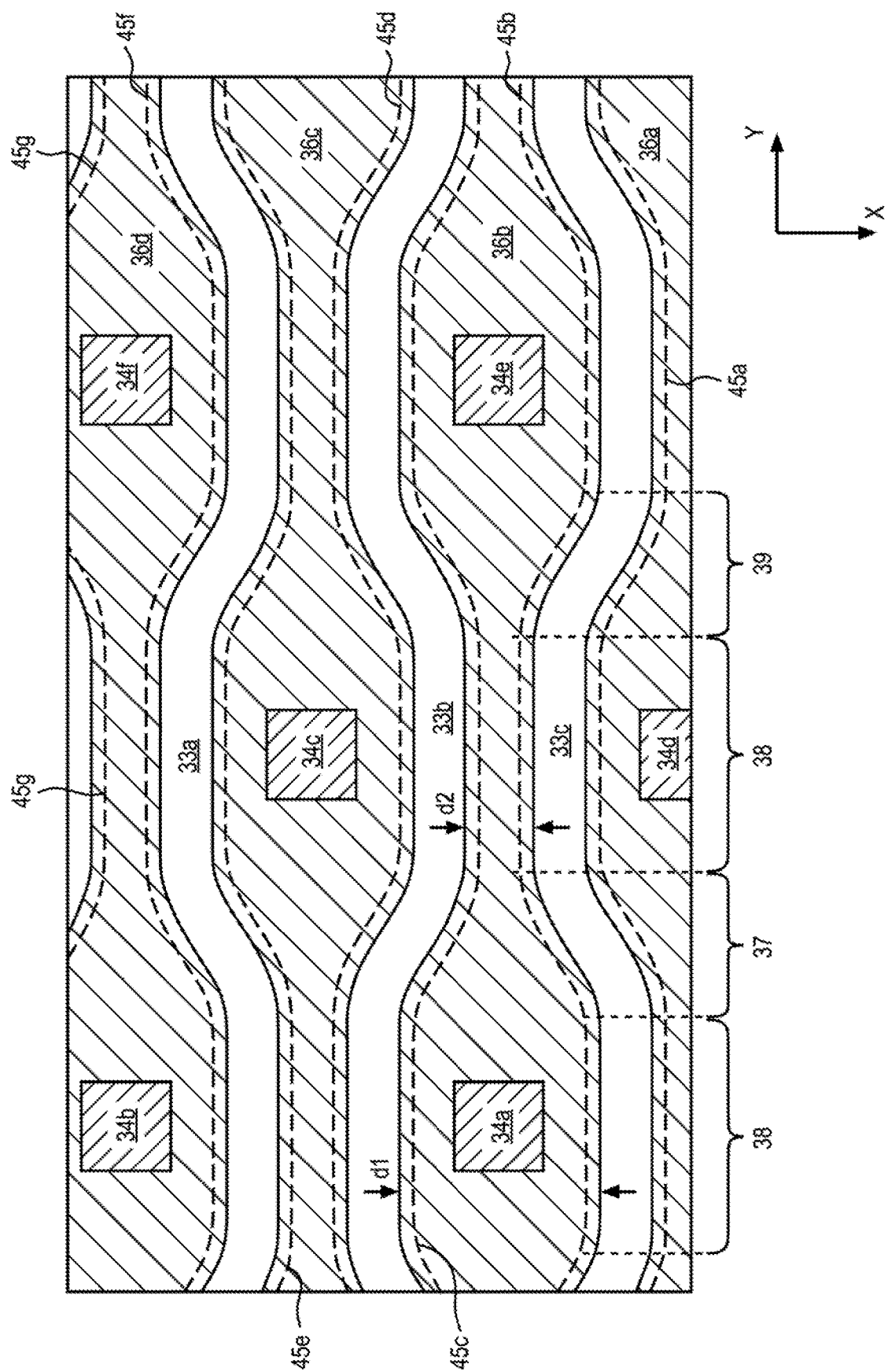
FIG. 4 is a top level view of the example layout of FIG. 3 additionally showing the location of gate members.

FIG. 4 is a top level view of the example layout of FIG. 3 additionally showing the location of gate members 45. For example, dashed lines 45a & 45b define the lateral sides of a gate member that extends over JFET region 33c, the adjoining channel regions, and a portion of the N+ source that adjoins the channel regions. Likewise, dashed lines 45c & 45d define the lateral sides of a gate member that extends over JFET region 33b, and dashed lines 45e & 45f define the lateral sides of a gate member that extends over JFET region 33a.

Figure 5:
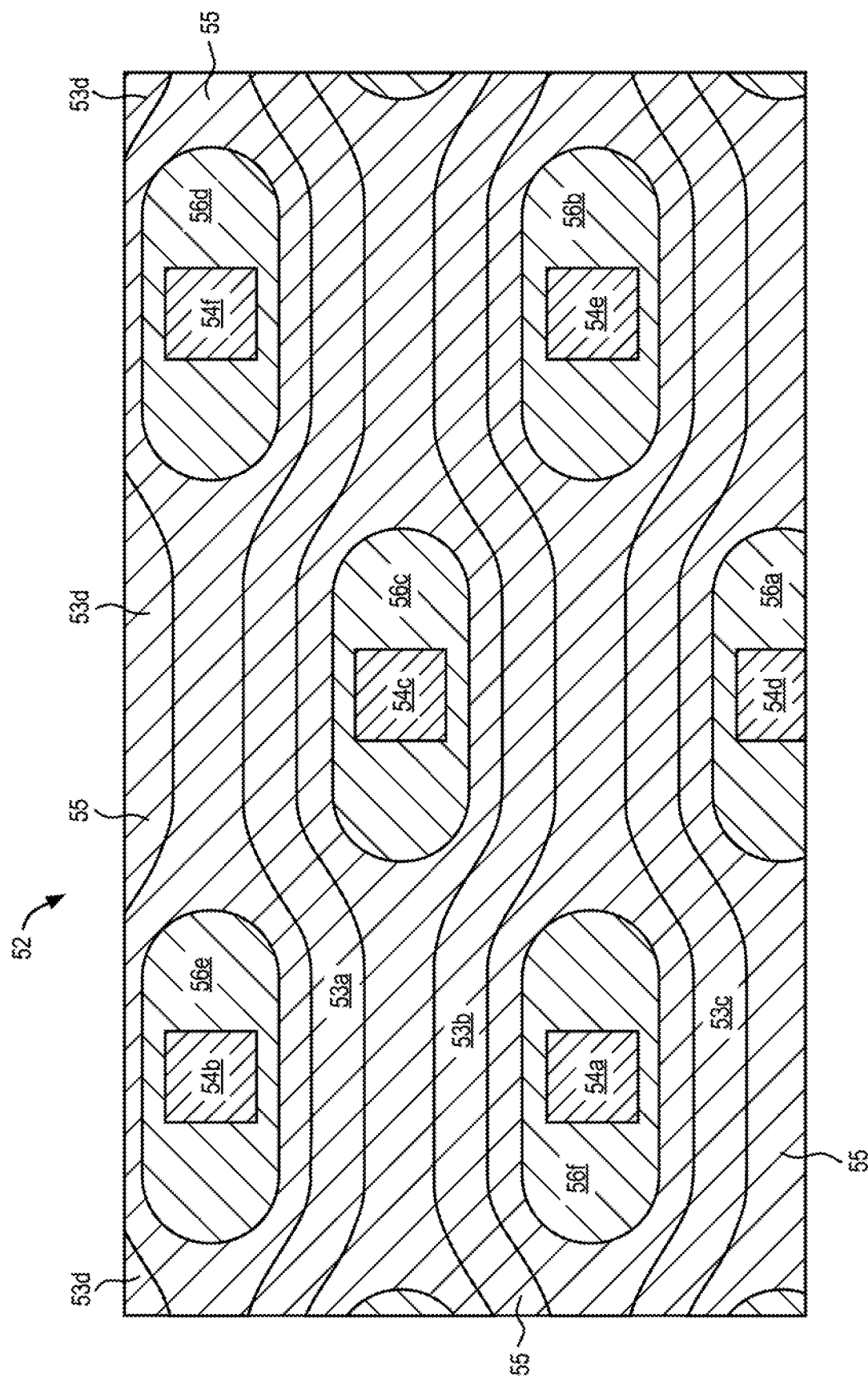
FIG. 5 is a top level view of another example layout for a SiC MOSFET device structure with a single merged gate member.

FIG. 5 is a top level view of another example layout for a SiC MOSFET device 52 with a single gate member 55. In this example layout the pitch in the X direction is substantially reduced, as compared with a conventional MOSFET (no wavy layout), such that adjacent wave-shaped JFET regions 53 are located close enough that the individual gate members (shown in FIG. 4) merge together to form a single gate member 55. Gate member 55 is shown covering the entire layout except for oval or racetrack-shaped open areas 56 where a P+ body region 54 is centrally-located. For example, gate member 55 covers JFET regions 53a & 53b and the area in between, except for the racetrack-shaped opening 56c that includes P+ body region 54c. Similarly, gate member 55 covers JFET regions 53b & 53c and the area in between, except for the racetrack-shaped areas 56b & 56f that respectively include P+ body regions 54e & 54a.

Note that the N+ source regions and the P− well regions are not shown in the layout of FIG. 5 for clarity reasons. Persons of skill in the art will understand that the P− well regions extend in the area between adjacent JFET regions 53. The N+ source regions cover the P− well regions except for the area adjacent the sides of JFET regions 53 where the channel regions are disposed. It should also be understood that the top metal layer that forms the source terminal of MOSFET 52 electrically contacts the N+ source regions and P+ body regions 54 only within the open areas 56. Gate member 55 is completely insulated from the top metal layer by an interlayer dielectric material (e.g., ILD 18 in FIG. 2).

Practitioners in the semiconductor arts will appreciate that the layout shown in FIG. 5 reduces pitch in the X direction, thereby increasing the total channel width in a given area, thus reducing channel resistance and hence $R_{on}$, as compared to the embodiments shown in FIGS. 3 & 4. In one embodiment with a channel length of about 1 µm, a JFET width of 1.4 µm, a 200 µm substrate thickness, and a 5 µm pitch(x), specific on-resistance was measured at 3.65 milliohms×cm², which is 12.5% lower than a conventional SiC MOSFET without serpentine or wavy regions. It is understood that improvement in the channel resistance may come at the expense of a slightly increased source resistance due to reduced source contact area, but $R_{on}$ is improved overall.

Persons of skill in the semiconductor arts will understand that in other embodiments there need not be a P+ body region contact 54 in each gate polysilicon opening 56.

Trench MOSFET with Wave-Shaped Channel Regions

Figure 6:
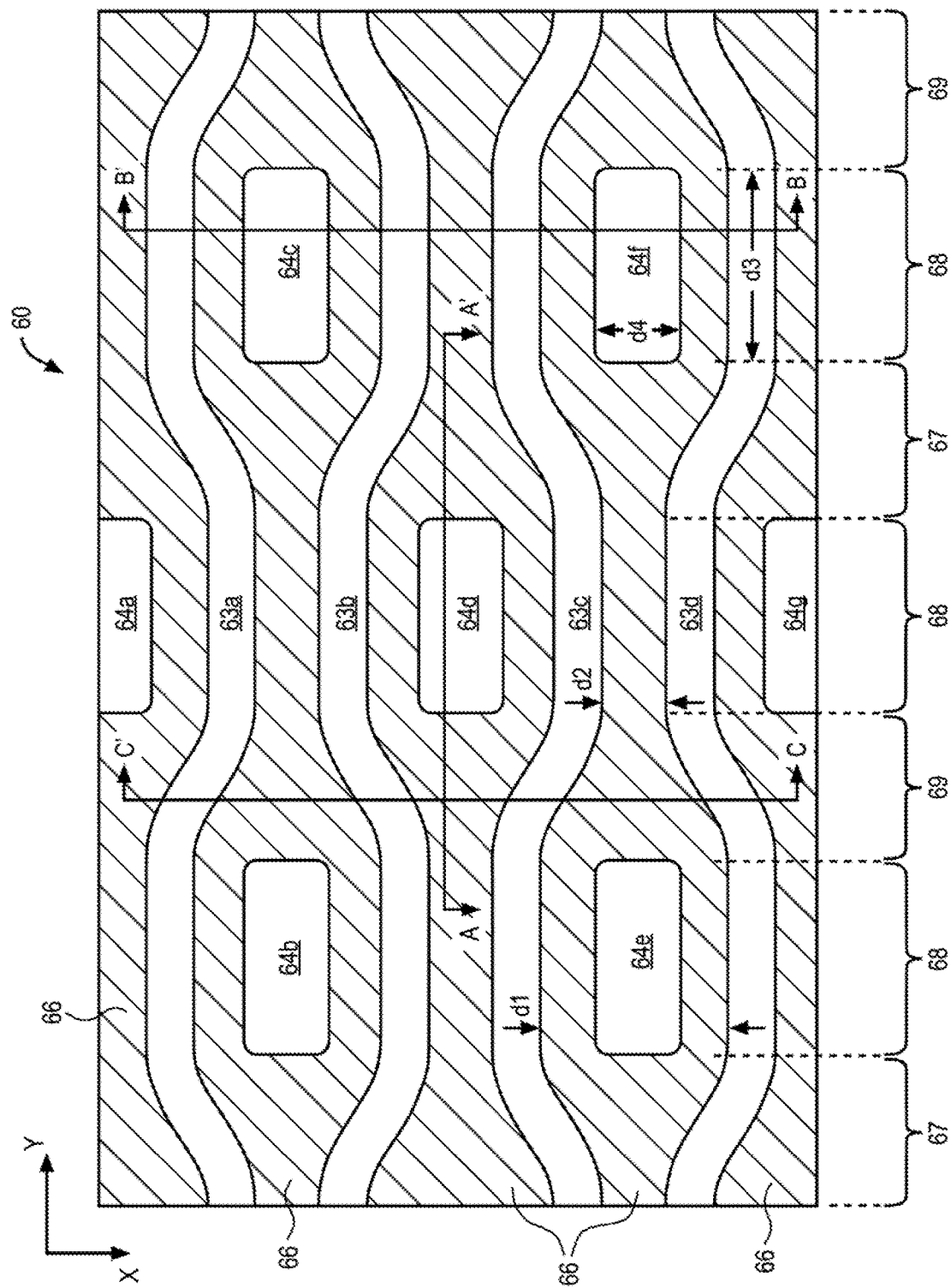
FIG. 6 is a top level view of an example layout for a SiC UMOSFET device structure with serpentine or wave-shaped regions.

FIG. 6 is a top level view of an example layout for a SiC UMOSFET 60 that includes a plurality of trenches 63 having a serpentine or wave-shaped pattern, where the curved wave-shape is alternately interrupted by straight sections. The layout of FIG. 6 shows trenches 63a-63d each having a serpentine shape with straight sections 68 that are alternately connected by curved sections 67 & 69. It is appreciated that sections 67 & 69 are identically-shaped but mirrored with respect to one another.

As shown, ascending section 69 shifts the wave-shaped layout up in the X direction and descending section 67 shifts it down in the X direction. Note that the straight sections 68 are all aligned with each other in the X direction with adjacent serpentine-shaped trenches 63 being 180 degrees out-of-phase. This layout causes the straight sections of adjacent trenches 63 to be alternately separated by a wide distance d1 and a narrow distance d2 measured in the X direction. Straight sections 68 each extend a lateral distance d3 in in the Y direction.

Another way to look at it is that the wave-shaped pattern of adjacent first trenches are arranged 180 degrees out of phase with one another such that the adjacent first trenches are alternately separated in the first lateral direction by minimum distance (d2) and then a maximum distance (d1) as the adjacent first trenches extend along the second lateral direction.

In one embodiment, the distance d1 may vary in a range of 1.8 µm to 3.0 µm; d2 may vary in a range of 0.6 µm to 1.0 µm; and d3 may vary in a range of 0.5 µm to 5.0 µm.

Also shown in the layout of FIG. 6 is a plurality of rounded rectangular trenches 64a-64g, each of which is centrally disposed in the area of the semiconductor substrate where trenches 63 are separated by the wide distance $d_1$. For example, trenches 64b & 64c are respectively disposed in the wide areas between trenches 63a & 63b; trench 64d is disposed in the wide area between trenches 63b & 63c, and trenches 64e & 64f are respectively disposed in the wide areas between trenches 63c & 63d. The cross-hatched area surrounding trenches 64, and between trenches 63 comprise the N+ source region 66 of the UMOSFET device. As shown, the lateral length of each trench 64 in the Y direction is substantially the same as the lateral distance d3 of each straight section of trenches 63. The lateral width of each trench 64 in the X direction is shown as the distance d4, which in one embodiment is in a range of about 0.6 µm to 1.0 µm. In one embodiment, the parallel sidewalls of adjacent trenches 64 & 63 are equally spaced-apart by predetermined distances in the X and Y directions.

Persons of skill in the semiconductor arts will appreciate that in the completely fabricated UMOSFET 60 a serpentine or wave-shaped gate member is disposed in each trench 63. The gate member is insulated from the adjacent N+ source region 66 by a thin gate oxide or other dielectric material. In the completed device, a deep P+ shield region is formed by ion implantation beneath the bottom of each trench 64. The P+ shield region functions to protect the bottom corner regions of the gate oxide in the adjacent trenches 63 from high electric fields, which makes the SiC UMOSFET block voltage reliable.

Figure 7:
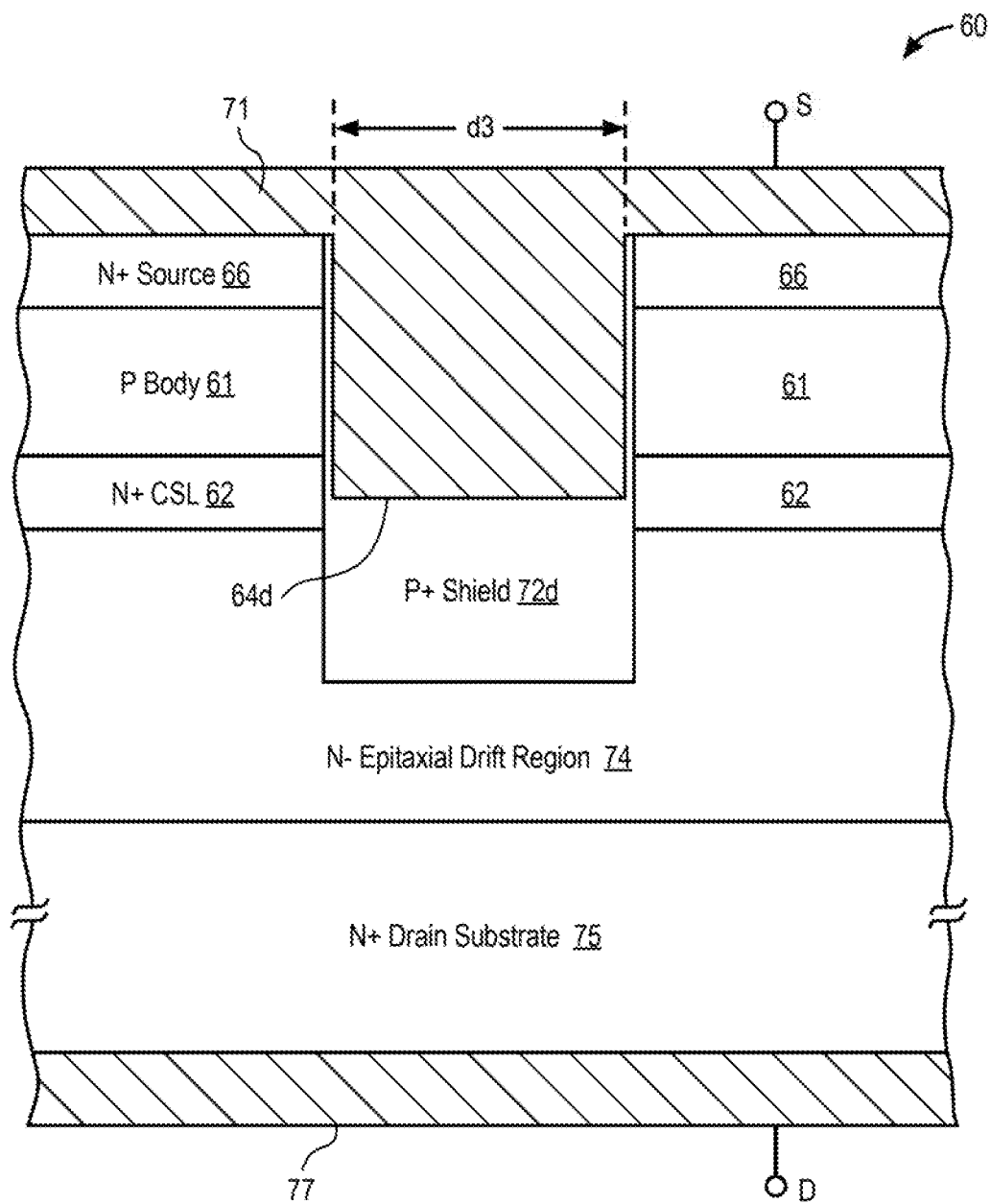
FIG. 7 is an example cross-sectional side view of the SiC UMOSFET shown in FIG. 6, as taken along cut lines A-A'.

FIG. 7 is an example cross-sectional side view of UMOSFET 60 shown in FIG. 6, as taken along cut lines A-A'. As shown, MOSFET 60 includes N+ source region 66 disposed at the top of the substrate. A P-type body region 61 vertically separates N+ source region 66 from N+ CSL region 62. A top metal layer 71 covers N+ source region 66 along the top planar surface of the SiC substrate and completely fills trench 64d, making ohmic contact and anchoring the trench sidewalls and bottom to the source potential. In this example, the bottom of trench 64d extends downward into N+ CSL region 62.

A P+ shield implant region 72d is shown vertically extending from the bottom of trench 64d deeply into N-type epitaxial drift region 74, which is disposed directly above N+ drain substrate 75. A bottom metal layer 77 forms the drain contact that provides an electrical connection to the bottom planar surface of N+ drain substrate 75. Note that P+ shield implant region 72d extends upward to the top of the adjacent substrate mesas. In addition to creating P+ region 72d beneath trench 64d, the P-type dopant is also implanted to a shallow extend on the sidewalls of trench 64d. This implant converts the entire trench sidewall surface to P+ doping.

Top metal 71 forms a source and shield contact. In addition to providing an electrical contact with source 66, metal 71 also makes electrical contact with body region 61, CSL 62 and P+ shield region 72d.

Figure 8:
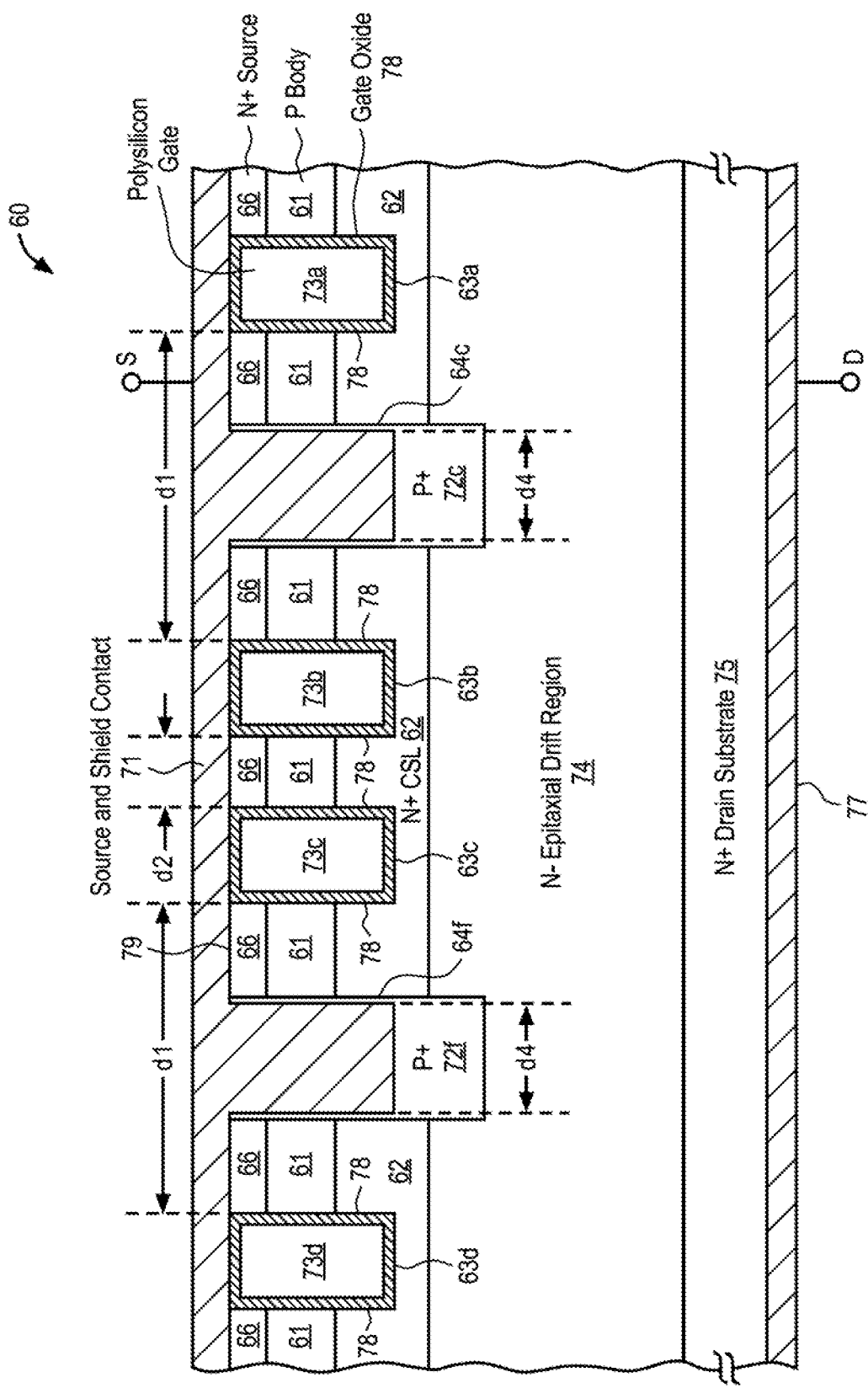
FIG. 8 is an example cross-sectional side view of the SiC UMOSFET shown in FIG. 6, as taken along cut lines B-B'.

FIG. 8 is an example cross-sectional side view of the SiC UMOSFET 60 shown in FIG. 6, as taken along cut lines B-B'. Four UMOSFET trenches 63a-63d and two shield trenches 64c and 64f are shown laterally spaced-apart in this cross-sectional view. Each of the MOSFET trenches 63a-63d are shown having vertical sidewalls covered with a gate oxide 78. Oxide is also shown covering the top and bottom of each trench to fully insulate corresponding polysilicon gate members 73a-73d from the laterally adjacent SiC mesas. Each mesa includes N+ source region 66 disposed at the top planar surface 79 of the substrate, P body region 61 and N+ CSL 62. Each trench 63 down into N+ CSL 62. In the on-state a vertical conduction channel is formed in P body region 61 along the sidewall of each MOSFET trench 63.

In one embodiment, the width in the X direction of each trench 63 and mesa is about 1.0 µm. Thus, in one embodiment UMOSFET 60 has four channel regions in a cell pitch of 6.0 µm, which amounts to 1.5 µm/channel. This can be seen by tracing a full pitch along the cross-section B-B'. This represents a substantial reduction in pitch reduction compared to prior art device structures. In addition to pitch reduction, channel width (as measured along the length of the sidewalls of wave-shaped trenches 63 in the Y direction) within a cell is greater as compared with prior art stripe channel designs. This is due to the fact that the length of a wave between any two points is necessarily longer than a straight line connected them. Persons of skill will also understand that compared with traditional trench SiC MOSFET device structures, UMOSFET 60 has less of a JFET pinch-effect, and hence lower specific on-resistance ($R_{on}$).

Continuing with the cross-section of FIG. 8, shield trench 64f is shown laterally disposed between MOSFET trenches 63c & 63d. Similarly, shield trench 64c is shown laterally disposed between MOSFET trenches 63a & 63b. Each trench 64 is disposed not more than a predetermined distance from the adjacent serpentine or wave-shaped trenches 63. Persons of skill in the art will appreciate that spacing apart trenches 64 a fixed distance from wave-shaped trenches 63 eliminates the risk of having the P+ shield implant affect channel doping adjoining the sidewalls of trenches 63. At the same time, the P+ shield implant converts the semiconductor sidewalls of trenches 64 to P+ doping, thus providing ohmic contact with the adjoining semiconductor regions 61, 62, 66 and epitaxial drift region (layer) 74.

As shown, P+ shield implant regions 72f & 72c extend deep into drift region 74 beneath respective trenches 64f & 64c to advantageously protect the bottom corner areas of the gate oxide regions 78 from potentially damaging high electric fields. In one embodiment, each P+ shield implant region extends 2.0-3.0 µm beneath the bottom of corresponding trenches 64. Since the vertical sidewalls of trenches 64 are implanted by glancing ions of lower energy, implant depths into the lateral sidewalls are considerably less deep, i.e., less than 10% of the vertical implant depth at the bottom of trenches 64.

Note that the adjacent-facing sidewalls of trenches 63b & 63c are separated laterally by distance d2, whereas the adjacent-facing sidewalls of trenches 63a & 63b, as well as trenches 63c & 63d, are separated laterally by distance d1. Note further that all of the trenches 63 & 64 are formed to the same vertical depth beneath top planar substrate surface 79.

Figure 9:
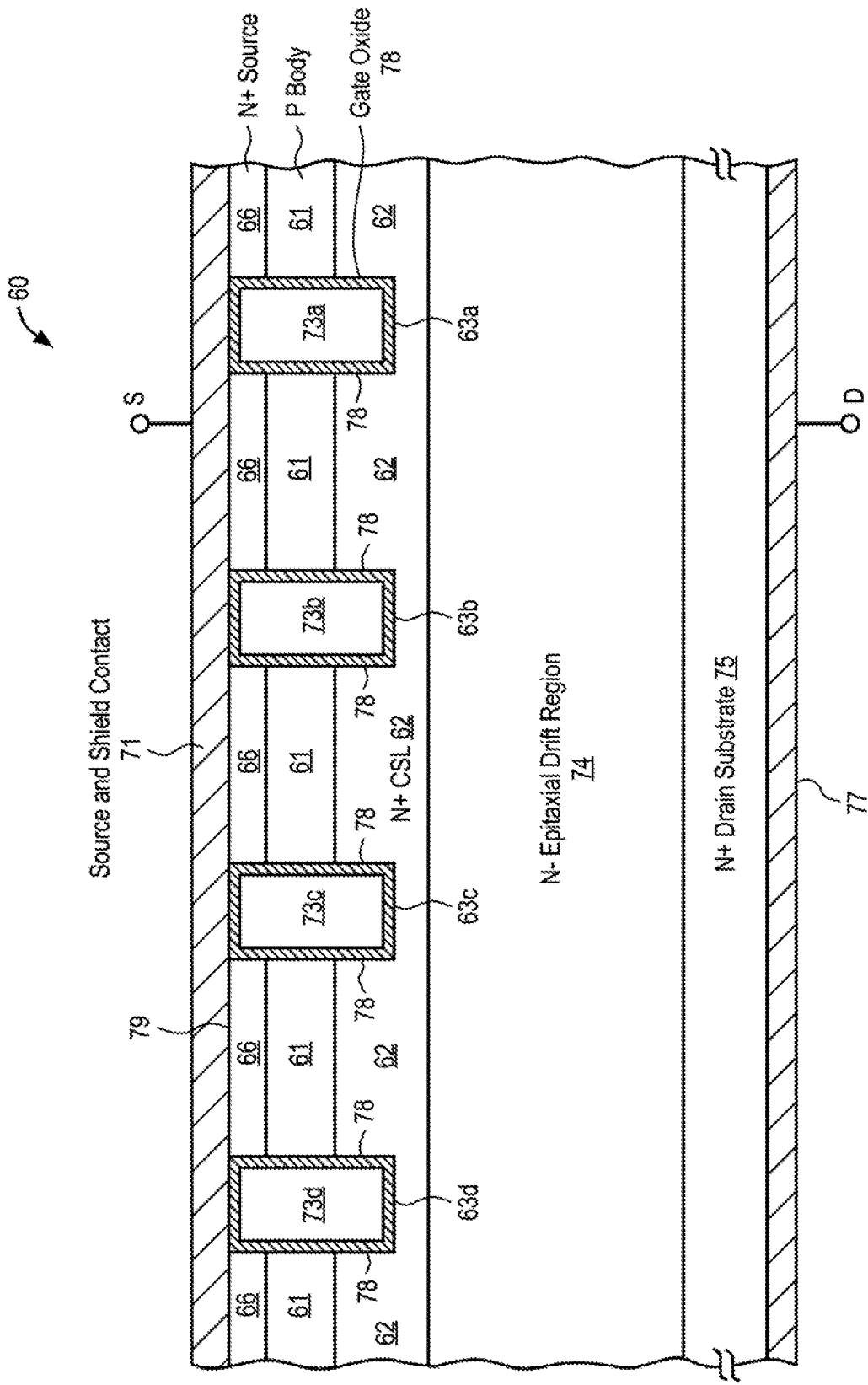
FIG. 9 is an example cross-sectional side view of the SiC UMOSFET shown in FIG. 6, as taken along cut lines C-C'.

FIG. 9 is an example cross-sectional side view of SiC UMOSFET 60 shown in FIG. 6, as taken along cut lines C-C'. As shown, trenches 63a-63d are substantially equally spaced apart from one another without any trenches 64 in the cross-section. That means that this view is through MOSFET cells only. It is also appreciated that the view of trenches 63 is taken through a curved section (either 67 or 69) of the wave shape, and not through any straight section 68.

Figure 10A:
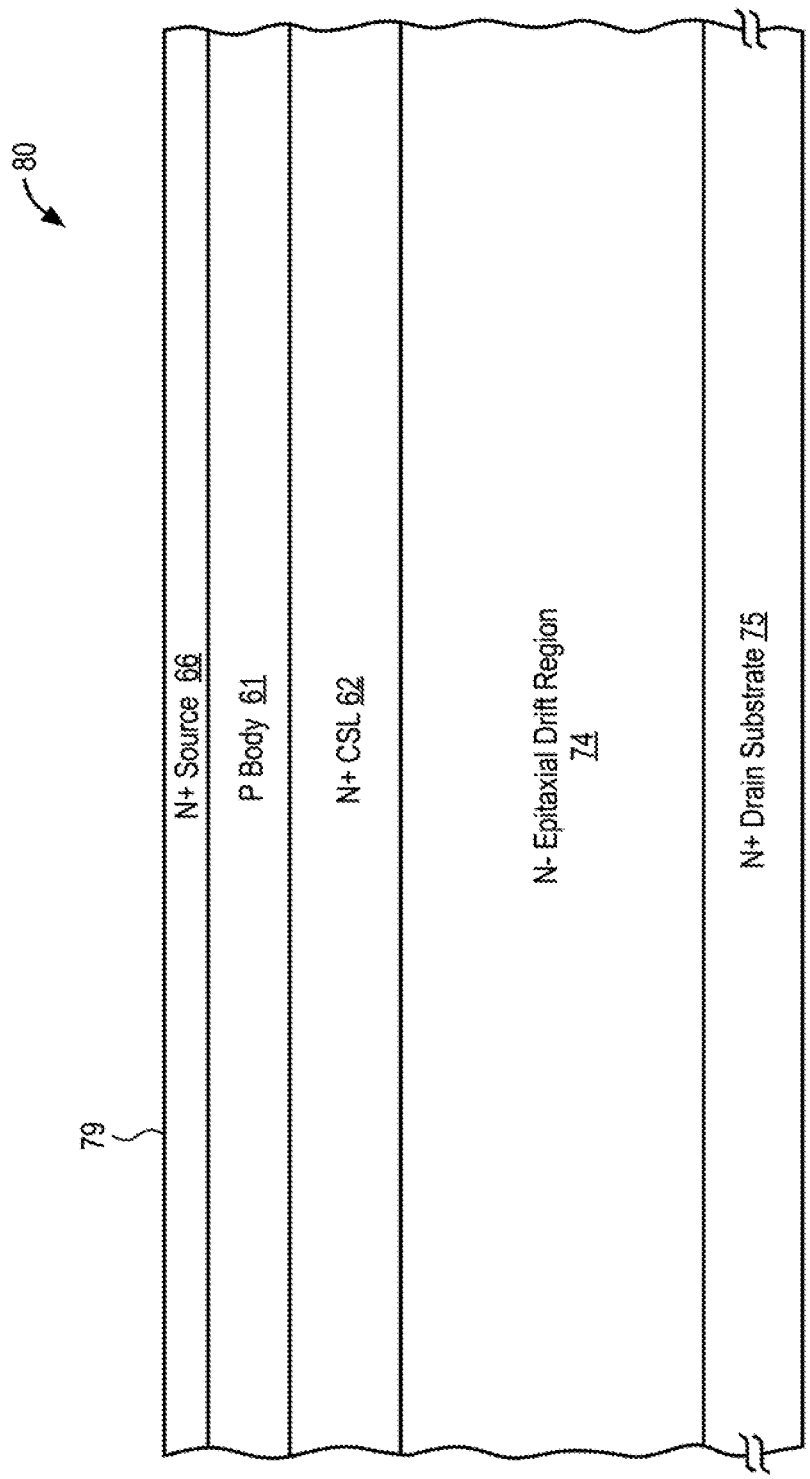
FIGS. 10A-10D show example cross-sectional side views of a SiC wafer at various stages of the fabrication process of the SiC UMOSFET shown in FIG. 6, as taken along cut lines B-B'.

FIGS. 10A-10D show example cross-sectional side views of a SiC wafer at various stages of the fabrication process of the SiC UMOSFET shown in FIG. 6, as taken along cut lines B-B'. FIG. 10A shows a SiC wafer 80 after formation of various semiconductor layers. As shown, a highly-doped N+ drain substrate 75 is disposed at the bottom planar surface of SiC wafer 80. A lightly-doped N– epitaxial layer 74 is shown formed above N+ drain substrate 75. Epitaxial layer 74 functions an extended drain or drift region of SiC UMOSFET. Epitaxial layer 74 may be formed by a Chemical Vapor Deposition (CVD) process.

A highly-doped N+ current spreading layer (CSL) 62 is shown formed on top of N– epitaxy layer 74. A P-type body 61 is formed on top of N+ CSL 62. An N+ source 66 is shown formed beneath top planar substrate surface 79 directly above P-type body 61.

By way of example, in one embodiment of a 1200 V UMOSFET device N– epitaxial layer 74 may have a doping concentration of about 9E15/cm3 and a thickness of about 10 µm. Bottom N+ drain substrate 75 may have a doping concentration of about 4E18/cm3 with the thickness being in a range of 100 µm to 360 µm. N+ source 66 is shallow and doped to a concentration of about 1E19/cm3. P-type body 61 is doped to a concentration of about 1E17/cm3, and has a thickness of about 1 µm. N+ CSL 62 is doped to a concentration of about 1E17/cm3 and has a thickness of 0.75 µm.

Figure 10B:
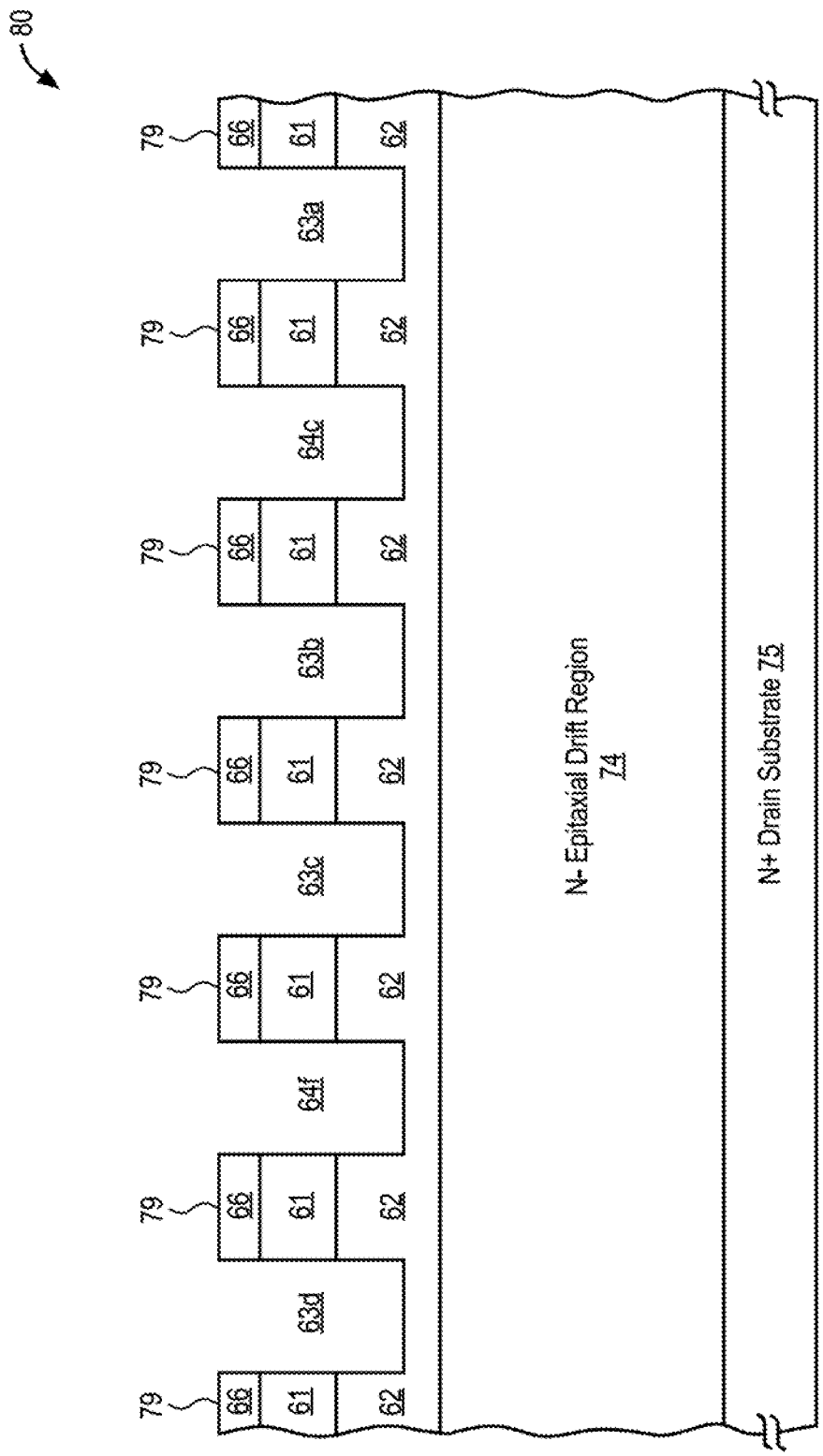

FIG. 10B shows SiC wafer 80 after masking and reactive ion etching steps that form MOSFET trenches 63a-63d and shielding trenches 64c & 64f. Trenches 63 and 64 may be etched together to the same depth. Both trenches 63 and 64 define a plurality of MOSFET mesas that extend from top substrate surface 79 down into N+ CSL 62. Each mesa consists of stacked regions N+ CSL 62, P-type body 61 and N+ source 66.

Figure 10C:
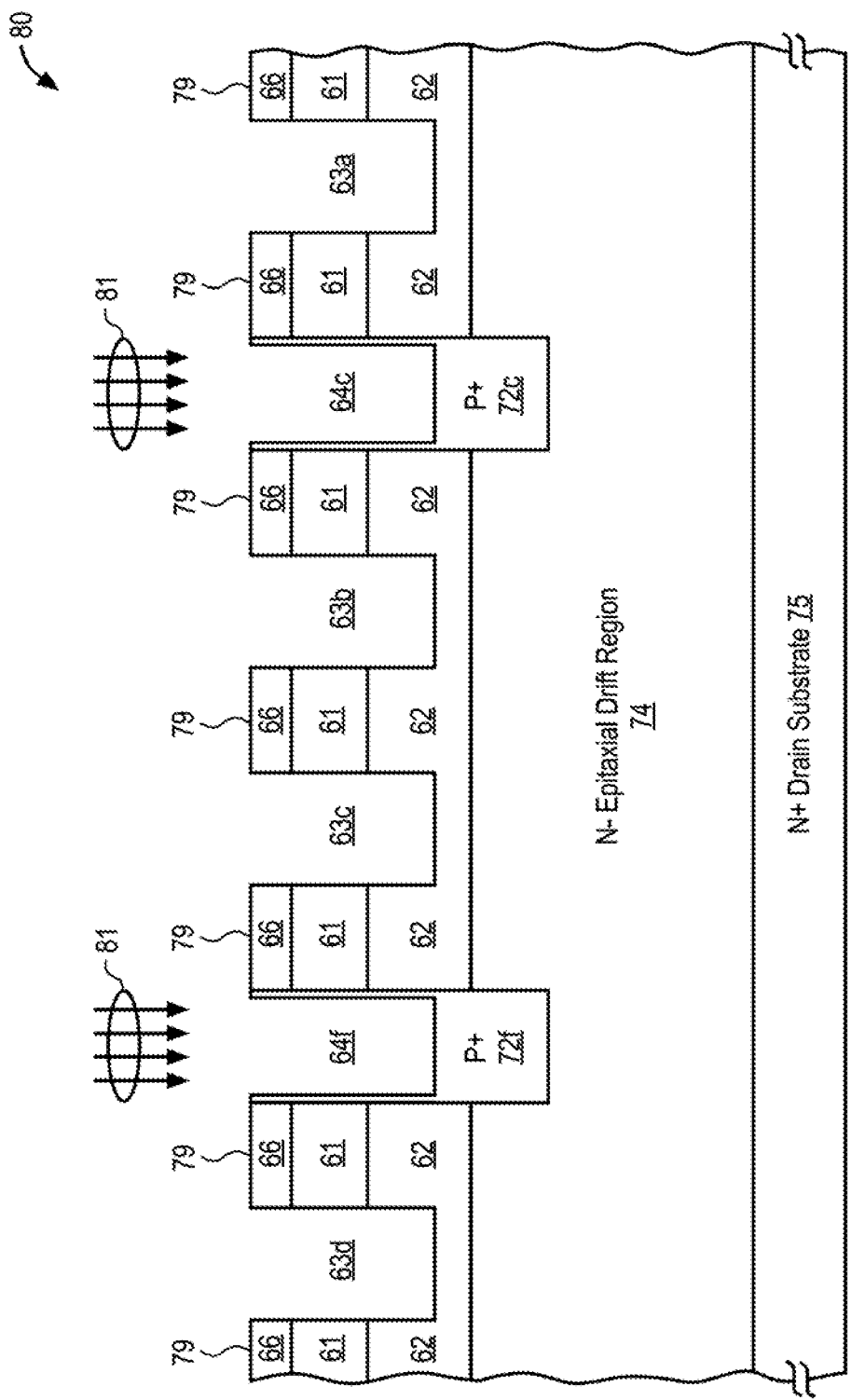

FIG. 10C shows SiC wafer 80 after ion implantation 81 that forms P+ shield regions 72f & 72c that extend downward into N-epitaxial drift region 74 beneath trenches 64f & 64c. Note that ion implantation 81 also forms shallow P+ regions 72f & 72c on the sidewalls of trenches 64f & 64c, converting the semiconductor sidewall regions 62, 61 and 62 to P+ doping. In one embodiment, P+ shield regions 72f & 72c are doped to a concentration of about 2E19/cm3.

Figure 10D:
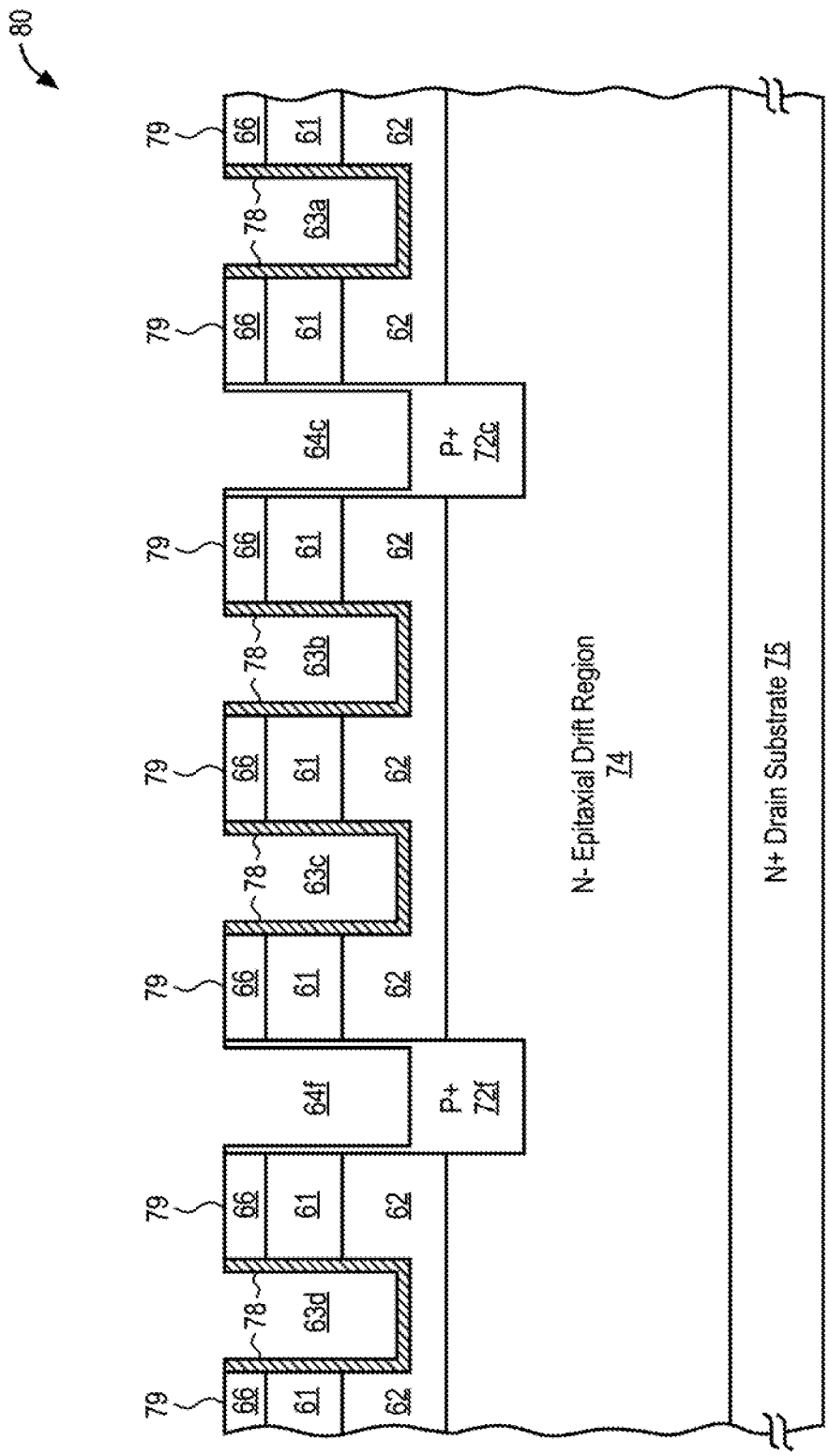

FIG. 10D shows SiC wafer 80 after masking and oxidation steps that form gate oxide layers 78 along the sidewalls of MOSFET trenches 63a-63d. After the gate oxide has been grown, each of trenches 63 are filled with polysilicon, which forms the gate members of the MOSFET cells. The top of the polysilicon gate members may be oxidized or otherwise insulated from the subsequent metallization steps that form the source and drain contacts on the respective top and bottom surfaces of wafer 80.

Figure 11:
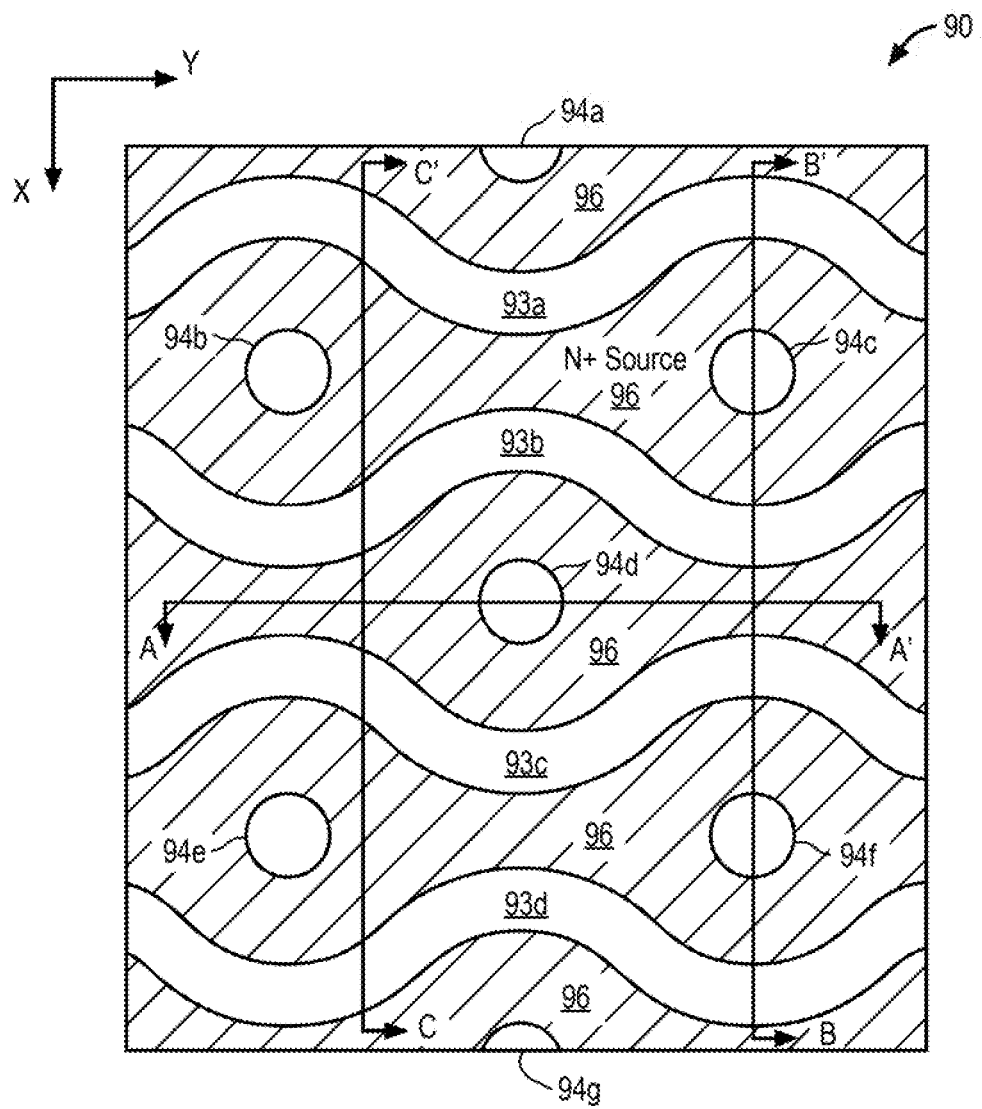
FIG. 11 is a top level view of another example layout for a SiC UMOSFET device structure having wave-shaped trench regions.

FIG. 11 is a top level view of another example layout for a SiC UMOSFET 90 having wave-shaped trenches 93a-93d. The layout of UMOSFET 90 is similar to that shown in FIG. 6, except that there are no parallel straight sections, and the shielding trenches 94 have a circular shape (cylindrically into the SiC substrate) instead of a rectangular shape.

Each of the serpentine or wave-shaped trenches 93 are laterally surrounded at the top substrate surface by N+ source regions 96. As shown, in the X direction, the wave shapes of adjacent trenches 93 are 180 degrees out of phase. Each trench 94 is disposed in the central area of N+ source region 96 where adjacent trenches 93 are farthest apart in the X direction. As can be seen, trenches 94b and 94c are disposed between MOSFET trenches 93a and 93b; trench 94d is disposed between trenches 93b and 93c; and trenches 94e and 94f are disposed between MOSFET trenches 93c and 93d.

Practitioners in the art will appreciate that the cross-sectional side views of SiC UMOSFET 90 taken along cut lines A-A', B-B' and C-C' are substantially the same as those shown in respective FIGS. 7-9. That is, all of the doped semiconductor layers/regions are the same and all of the trenches 93 & 94 have the same depth of corresponding features shown in FIG. 6. The primary difference is the lateral size (diameter) of trench 94d in the Y direction, taken along cut line A-A', is substantially shorter than the length of trench 64d in the Y direction.

It is appreciated that in the example shown in FIG. 11 the diameter of each trench 94 is substantially equal in dimension to the lateral width of each trench 93 in the X direction (e.g., 1 μm). In other embodiments, the size of trenches 94c may vary, as well as the lateral spacing and size in relation to MOSFET trenches 93a & 93b. In other words, in certain embodiments the diameter of each trench 94 may be larger or smaller than the lateral width of each trench 93, as measured in the X direction.

The above description of illustrated example embodiments, including what is described in the Abstract, are not intended to be exhaustive or to be limitations to the precise forms or structures disclosed. While specific embodiments and examples of the subject matter described herein are for illustrative purposes, various equivalent modifications are possible without departing from the broader spirit and scope of the present invention. Indeed, it is appreciated that the specific example thicknesses, dimensions, material types, concentrations, voltages, etc., are provided for explanation purposes and that other values may also be employed in other embodiments and examples in accordance with the teachings of the present invention.

I claim:

1. A metal-oxide semiconductor transistor (MOSFET) comprising:
    a silicon carbide (SiC) substrate having top and bottom planar surfaces;
    a drain region of a first conductivity type disposed at the bottom planar surface;
    a drift region of the first conductivity type disposed above the drain region;
    a current spreading layer (CSL) of the first conductivity type disposed above the drift region;
    a source region of the first conductivity type disposed at the top planar surface;
    a body region of a second conductivity type that vertically separates the source region from the CSL;
    a plurality of first and second trenches each of which extends a predetermined vertical distance from the top planar surface down through the body region and into the CSL, each of the first and second trenches having sidewalls and a bottom, each of the first trenches including a gate member insulated from the sidewalls and the bottom of the first trench by a gate oxide, each of the second trenches being disposed between a pair of adjacent first trenches in a first cross-section taken in a first lateral direction;
    a shielding region of the second conductivity type disposed beneath the bottom of each of the second trenches, the shielding region extending vertically down from the bottom into the drift region;
    a top metal layer that fills each of the second trenches and electrically contacts the source region, the body region, the CSL, and the shielding region;
    a bottom metal layer that electrically contacts the drain region;
    when the MOSFET is in an on-state with a high voltage applied to the gate member relative to the source, a conduction channel is formed along the sidewalls of the first trenches such that a current flows vertically from the source region to the CSL region, and then in a vertical direction down through the drift region to the drain region; and
    wherein the first trenches are each arranged in a wave-shaped pattern at the top planar surface, the wave-shaped pattern extending in first and second lateral directions.

2. The MOSFET of claim 1 wherein the wave-shaped pattern comprise semi-circular regions that extend in the first and second lateral directions, with the semi-circular regions alternating orientation by 180 degrees along the second lateral direction.

3. The MOSFET of claim 1 wherein the second trenches have a cylindrical shape with a circular cross-section in the first and second lateral directions.

4. The MOSFET of claim 1 wherein a width of each of the first trenches, as measured at any tangential point along the wave-shaped pattern between opposing sidewalls, is a constant distance.

5. The MOSFET of claim 3 wherein the constant distance is in a range of about 0.6 μm to 1.2 μm.

6. The MOSFET of claim 1 wherein the wave-shaped pattern comprise curved sections connected by straight sections, the straight sections extending in the second lateral direction, and the curved sections extending in the first and second lateral directions such that the curved sections alternately shift the straight sections a predetermined distance in the first lateral direction.

7. The MOSFET of claim 5 wherein each of the straight sections extends a predetermined distance in the second lateral direction.

8. The MOSFET of claim 6 wherein the second trenches each have a substantially rectangular shape that extends the predetermined distance in the second lateral direction.

9. The MOSFET of claim 1 further comprising a shallow region of the second conductivity type that extends vertically along the sidewalls of each of the second trenches from the top planar surface down to the shielding region.

10. The MOSFET of claim 1 wherein each shielding region extends from beneath the bottom of each corresponding second trench down a vertical distance of about 2.0 μm to 3.0 μm deep.

11. The MOSFET of claim 1 wherein the first conductivity type is N-type and the second conductivity type is P-type.

12. The MOSFET of claim 1 wherein in a second cross-section taken in the first lateral direction there is an absence of second trenches between adjacent first trenches.

13. A metal-oxide semiconductor transistor (MOSFET) comprising:
    a silicon carbide (SiC) substrate having top and bottom planar surfaces;
    a drain region of a first conductivity type disposed at the bottom planar surface;
    a drift region of the first conductivity type disposed above the drain region;
    a current spreading layer (CSL) of the first conductivity type disposed above the drift region;
    a source region of the first conductivity type disposed at the top planar surface;
    a body region of a second conductivity type that vertically separates the source region from the CSL;
    a plurality of first and second trenches each of which extends a predetermined vertical distance from the top planar surface down through the body region and into the CSL, each of the first and second trenches having sidewalls and a bottom, each of the first trenches including a gate member insulated from the sidewalls and the bottom of the first trench by a gate oxide, each of the second trenches being disposed between a pair of adjacent first trenches in a first cross-section taken in a first lateral direction;
    a shielding region of the second conductivity type disposed beneath the bottom of each of the second trenches, the shielding region extending vertically down from the bottom into the drift region;
    a top metal layer that fills each of the second trenches and electrically contacts the source region, the body region, the CSL, and the shielding region;
    a bottom metal layer that electrically contacts the drain region;
    when the MOSFET is in an on-state with a high voltage applied to the gate member relative to the source, a conduction channel is formed along the sidewalls of the first trenches such that a current flows vertically from the source region to the CSL region, and then in a vertical direction down through the drift region to the drain region; and
    wherein each of the first trenches are each arranged in a wave-shaped pattern at the top planar surface, the wave-shaped pattern extending in first and second lateral directions that comprise semi-circular regions that extend in the first and second lateral directions, with the semi-circular regions alternating orientation by 180 degrees along the second lateral direction.

14. The MOSFET of claim 12 wherein the wave-shaped pattern of adjacent first trenches are arranged 180 degrees out of phase with one another such that the adjacent first trenches are alternately separated in the first lateral direction by a minimum distance and a maximum distance as the adjacent first trenches extend along the second lateral direction.

15. The MOSFET of claim 12 wherein the second trenches have a cylindrical shape with a circular cross-section in the first and second lateral directions.

16. The MOSFET of claim 12 wherein a width of each of the first trenches, as measured at any tangential point along the wave-shaped pattern between opposing sidewalls, is a constant distance.

17. The MOSFET of claim 15 wherein the constant distance is in a range of about 0.6 μm to 1.2 μm.

18. The MOSFET of claim 12 further comprising a shallow region of the second conductivity type that extends vertically along the sidewalls of each of the second trenches from the top planar surface down to the shielding region.

19. The MOSFET of claim 12 wherein the conduction channel has a wave-shaped pattern in the first and second directions that follows the wave-shaped pattern of the first trenches.

20. The MOSFET of claim 12 wherein the first conductivity type is N-type and the second conductivity type is P-type.

21. The MOSFET of claim 12 wherein in a second cross-section taken in the first lateral direction there is an absence of second trenches between adjacent first trenches.

* * * * *